US004001570B2

United States Statutory Invention Registration [19]

[11] Reg. Number: H1570

[45] Published: Aug. 6, 1996

Lux et al.

[54] VARIABLE LATERAL QUANTUM CONFINEMENT TRANSISTOR

[75] Inventors: Robert A. Lux, Toms River; James F. Harvey, Tinton Falls, both of N.J.

[73] Assignee: The United States of America as represented by the Secretary of the Army, Washington, D.C.

[21] Appl. No.: 44,783

[22] Filed: Mar. 31, 1993

[51] Int. Cl.[6] ..... H01L 29/06

[52] U.S. Cl. ..... 257/25; 257/20; 257/24; 257/27

[58] Field of Search ..... 257/20, 23, 24, 257/27

[56] References Cited

U.S. PATENT DOCUMENTS

| | | | |
|---|---|---|---|
| 4,812,886 | 3/1989 | Smith, III | 257/26 |
| 4,926,232 | 5/1990 | Ando et al. . | |
| 4,959,696 | 9/1990 | Frensley et al. . | |
| 4,973,858 | 11/1990 | Chang . | |
| 4,974,037 | 11/1990 | Beneking | 257/472 |
| 4,999,697 | 3/1991 | Capasso et al. . | |
| 5,017,973 | 5/1991 | Mizuta et al. . | |
| 5,021,863 | 6/1991 | Yokoyama . | |
| 5,023,674 | 6/1991 | Hikosaka et al. . | |
| 5,093,699 | 3/1992 | Weichold et al. | 257/24 |
| 5,130,766 | 7/1992 | Arimoto | 257/20 |
| 5,234,848 | 8/1993 | Seabaugh | 257/27 |
| 5,283,445 | 2/1994 | Saito | 257/24 |

OTHER PUBLICATIONS

"Resonant Tunneling In Semiconductor Double Barriers", L. L. Chang et al, Applied Physics Letters, vol. 24, No. 12, pp. 593–595, 15 Jun. 1974.

F. Beltram et al, Applied Physical Letters, vol. 53, p. 219 (1988).

A. A. Grinberg et al, Journal of Applied Physics, vol. 66, p. 425 (1989).

A. C. Seabaugh et al, IEEE Trans. Electronic Devices, vol. 36, p. 2328 (1989).

C. H. Yang, Applied Physical Letters, vol. 60, p. 1250 (1992).

*Primary Examiner*—Bernarr E. Gregory

*Attorney, Agent, or Firm*—Michael Zelenka; William H. Anderson

[57] ABSTRACT

A quantum interference device in the form of a variable lateral confinement resonant tunneling transistor having a quantum waveguide structure including a primary current transmission path defined by a region between source and drain electrodes and where there is a resonance region therebetween in which quantum interference of tunneling wave functions establish a resonance tunneling condition that extends beyond the primary current path. Upon the application of a voltage across the drain and source electrodes, a tunneling current can be made to flow. A gate electrode formed on the quantum well structure remote from the primary current transmission path includes a variable depletion region thereunder or an electrostatic pinch off region, the size of which is a function of the magnitude of the bias voltage applied thereto. The size of the depletion region or the pinch off region affects the dimensions of the resonance region and accordingly the current flow between the source and drain electrodes as a result of a change in the energy and momentum conditions for resonance tunneling.

9 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

VARIABLE LATERAL QUANTUM CONFINEMENT TRANSISTOR

GOVERNMENT INTEREST

This invention may be used, made, sold or leased by or for the Government for governmental purposes without the payment to us of any royalties thereon or therefor.

BACKGROUND OF THE INVENTION

1. Field of the Invention

This invention relates generally to solid state electronics and more particularly to quantum interference devices.

2. Description of the Prior Art

Three terminal semiconductor devices, including a quantum well between two barriers, are generally known. Such devices implementing both digital and analog circuits result from the need for increased miniaturization, functional density, and operating speed, particularly where nanoelectronic and mesoscopic size regimes are concerned. Such devices are shown and described, for example, in the text entitled *Nanostructure Physics And Fabrication,* M. A. Reed et al, Academic Press, New York, 1989.

As is well known, a quantum well is comprised of a layered semiconductor structure in which the quantum well layer is sandwiched between two barrier layers of semiconductor or insulator material with larger conduction band energy, larger valence band energy, or both, than the quantum well layer. Electrical carriers (electrons or holes) tunnel resonantly through the barriers and quantum well when the resonant energy states inside the quantum well are favorably aligned with the energy of the carriers outside the barriers. The principle of resonant tunneling through barriers has been described, for example, in a publication entitled, "Resonant Tunneling In Semiconductor Double Barriers" L. L. Chang et al, which appeared in *Applied Physics Letters,* Volume 24, No. 12, 15 June 1974, pp. 593–595. The resonant energy level inside the quantum well acts as a filter of the electronic wave functions. The energy level of the resonant state within the quantum well places a restriction on the value of momentum in the direction of propagation for the electron wave functions which are transmitted through the quantum well barriers, instead of being reflected. As a result, the only electron wave functions which will be transmitted have a narrow range of values of momentum in the propagation direction. If the electron wave functions are unconstrained in the lateral directions (perpendicular to the direction of propagation), then a subband of transmitted electron energies results. This subband is due to the restriction on momentum in the propagation direction with no restriction placed on the lateral momenta. If the resonant energy level in the quantum well is below the conduction band edge (or above the valence band edge) of the source of carriers outside the barriers, no current can flow through the quantum well. The resonant tunnel diode uses a voltage difference placed across the entire resonant tunneling structure (the voltage difference being applied to semiconductor layers on either side of the barrier layers), to control the resonant energy level inside the quantum well. Constructing a quantum well with a resonant energy level above the conduction band edge, and then using a potential difference to pull it below the band edge results in switching the current from a condition of conduction to a non-conducting condition. Several attempts have been made to control the quantum well resonant energy level independently of the voltages on the layers outside the barriers, both by directly connecting to the quantum well layer and by indirectly influencing the energy level (for example by a quantum Stark effect). These devices have a third electrode controlling the quantum well resonant energy level, so they are resonant tunneling transistors, rather than diodes. These devices are discussed in F. Beltram et al, *Applied Physical Letters,* Vol. 53, pg 219 (1988); A. A. Grinberg et al, *Journal of Applied Physics,* Vol. 66, pg 425 (1989); A. C. Seabaugh et al, *IEEE Trans. Electronic Devices,* Vol. 36, pg. 2328 (1989); and C. H. Yang, *Applied Physical Letters,* Vol. 60, pg 1250 (1992). However, limited success has been achieved in manufacturing such devices because of the great difficulty in making electrical contact to the quantum well or in indirectly influencing the resonant level without affecting the outside semiconductor layers. Moreover, the resonant tunneling diodes and three terminal transistors described above are large, macroscopic devices, with lateral sizes of 1 micron or larger.

A second category of devices has been proposed for electronic switching in circuits consisting of conductors with extremely small dimensions (conductor widths of less than 100 nanometers). These conductors are often called electron waveguides or quantum wires and are distinguished by widths of less that the coherence lengths of the electron wave function (the so called "mesoscopic dimension"). The proposed switching devices operate on a quantum interference principle, and as a result all their critical dimensions must be mesoscopic. These quantum interference devices are discussed in the text by Reed et al. These devices have a major problem in their sensitivity to their environment, in particular, to thermal fluctuations. This sensitivity is due to the requirement for electron wave functions to travel by two separate paths and to recombine forming an interference pattern. This kind of interference is similar to the interference in a Michelson Interferometer, which is known to be very sensitive to thermal and other environmental conditions. Fluctuations of a random nature in either or both paths will destroy the interference pattern and will nullify the switching mechanism of the device.

SUMMARY OF THE INVENTION

It is object of the invention to provide an improvement in resonant tunneling semiconductor devices;

It is a further object of the invention to provide a three terminal quantum interference transistor operating on a Fabry-Perot interference principle, rather than a Michelson interference principle.

It is a further object of the invention to provide a quantum interference transistor suitable for integration into an IC composed of mesoscopic devices connected by-quantum waveguides or quantum wires.

Briefly, the foregoing and other objects of the invention are achieved by a quantum interference device in the form of a resonant tunneling transistor in which the resonant energy level in the quantum well is controlled by lateral confinement which is determined by the size of the quantum well region. The lateral dimension of the quantum well region is controlled by an electrostatic potential field or a depletion region which is imposed on the quantum well region by a remote voltage source. In this invention, source and drain electrodes of the transistor are electron waveguides which have lateral dimensions smaller than the electron wave function coherence length. The quantum well region is disposed between the source and drain electrodes and separated from the source and the drain by barrier regions. The barrier regions consist of higher potential energy than the source, drain, or quantum well, and are formed by semiconductor material with a higher conduction band energy or formed by a region with a higher electrostatic potential energy which is imposed from outside the structure, for example by a voltage on a metal ele- ment on the surface. The quantum well region has lateral dimensions which are greater than the lateral dimensions of the electron wave- guides, but still less than the coherence length of the electron wave function. Because its dimensions are less than the coherence length of the electron wave function, the entire quantum well region acts as a resonant chamber with the electron wave function spreading throughout the quantum well. Since the quantum well has a definite size, the resonant states of the electron inside the well are fixed with discrete resonant energy levels. Tunneling from the source to the drain through the quantum well is most probable through these resonant energy states. When the occupied energy subband of the electron waveguide coincides with a quantum well resonant energy level, there is a large tunneling probability and hence a large tunneling current. When the quantum well resonant energy level is not aligned with an occupied subband energy of the source, there is a low tunneling probability and a low tunneling current. The energies of the quantum well are controlled by the lateral size of the quantum well. Since the quantum well region extends beyond the dimensions of the source or drain waveguides, the lateral size of the quantum well can be controlled by a third gate electrode which either pinches off a portion of the quantum well electrostatically or changes a depletion region bordering the quantum well. Changing the lateral size of the quantum well using the third electrode changes the resonant energy level, which can be moved into and out of coincidence with the occupied subband in the source, turning the tunneling current on and off.

In the quantum well, the quantum interference of the tunneling wave functions establish the resonance tunneling conditions on the energy and momentum of the electron waves. The interference pattern set up in the quantum well is similar to the interference of optical waves in a Fabry-Perot interferometer, in which a wave interferes with itself, ie. reflected portions of the same wave interfere. This situation is in contrast to other quantum interference transistors, where the wave is split and the portions of the wave traveling over physically different paths interfere. This latter situation is similar to the interference of optical waves in a Michelson interferometer. The Michelson interferometer is notorious for its sensitivity to its environment, while the Fabry-Perot interferometer is a relatively robust device which is affected much less by environmental conditions and fluctuations. For this reason the invention proposed here is expected to be superior to other quantum interference transistors in that it will be much less affected by thermal and other environmental fluctuations.

In another embodiment of this device the source and drain are only confined in one lateral dimension to be smaller than the electron wave function coherence length. The quantum well is then confined in only two dimensions to be smaller than the coherence length. These two directions are the same confining lateral direction as the source and drain and the direction of propagation.

BRIEF DESCRIPTION OF THE DRAWINGS

The following detailed description of the invention will be more readily understood when considered in conjunction with the accompanying drawings in which.

DESCRIPTION OF THE PREFERRED EMBODIMENTS

This invention is directed to a structure where tunneling can occur through a region in which quantum interference of the tunneling wave functions can establish a resonance condition, e.g. in a quantum well. The resonance region also extends physically beyond the lateral dimensions of the electron waveguide of the source where electrical contacts are made in order to apply a voltage. This applied voltage produces additional confinement either by electrostatically pinching off a portion of the resonance region or by causing a depletion region. Changing the voltage changes the dimension of the pinched off region or the depletion region, which in turn changes the dimension of the resonance region and hence the momentum and energy conditions for resonant tunneling. It should be noted that the gate voltage does not apply a force directly to the electron in the tunneling region between the source and drain; nor does it make ohmic contact to carriers between the source and drain; nor does it change the electrical potential energy of the resonance region. Its only effect on the resonance energy level is to change the physical confinement of the resonance region in the lateral dimension at a location remote from the region between the source and drain. Changing the resonance condition, therefore, effectively modulates the output current of the device by changing the tunneling current.

Figure 4:
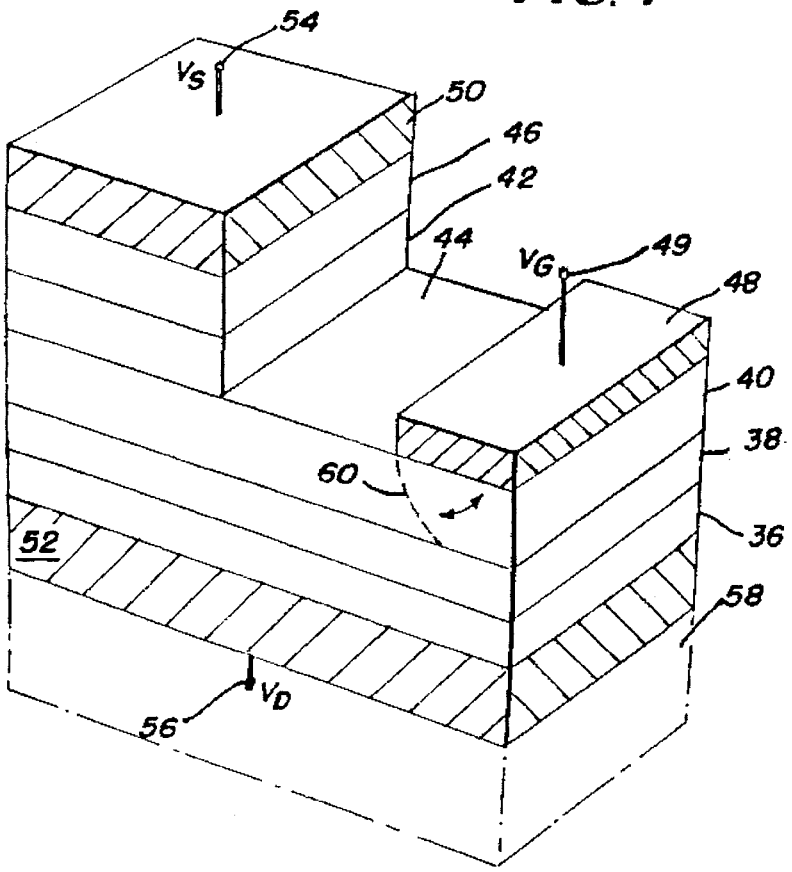

The preferred embodiments of the invention as shown in FIGS. 1, 2, 3 and 4 illustrate two basic transistor structures, one of which comprises a planar transistor (FIGS. 1, 2 and 3), while the second is directed to a multi-epilayered type device (FIG. 4). Both devices are fabricated from Group III–V compounds, and more particularly from gallium arsenide (GaAs) and aluminum gallium arsenide (AlGaAs). It should be noted at the outset, however, that such devices are not limited to GaAs devices, but can, when desired, be formed from other types of semiconductor and insulating materials which exhibit resonant tunneling operating characteristics.

Figure 1:
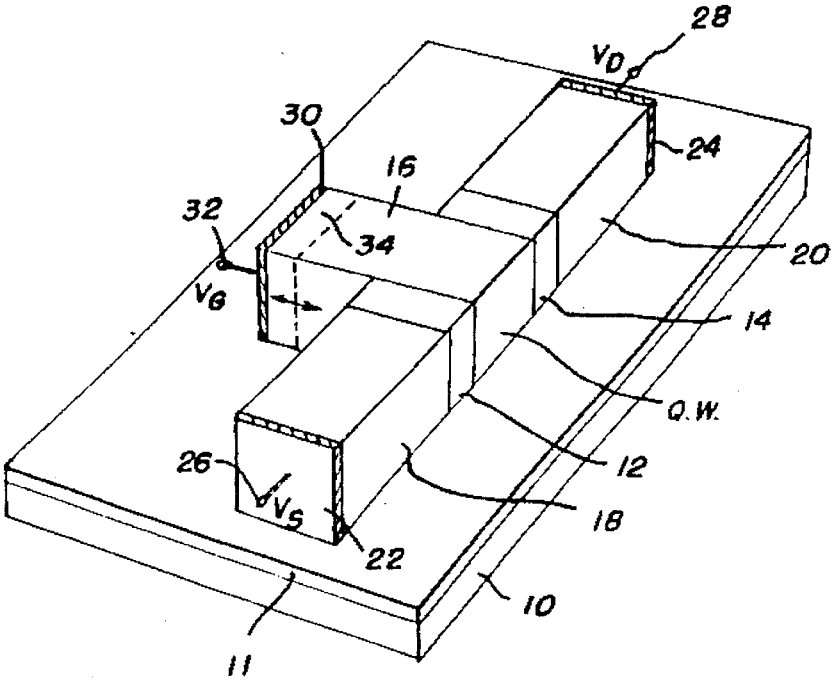
FIGS. 1, 2, 3 and 4 are perspective views illustrative of devices in accordance with preferred embodiments of the invention.

Referring now first to FIG. 1, a resonant tunneling structure of mesoscopic dimensions is formed on a semi-insulating GaAs substrate 10, which is isolated by a layer of AlGaAs 11. On the upper surface of the isolating AlGaAs layer are two barrier regions 12 and 14 comprised of aluminum gallium arsenide (AlGaAs) which are located on either side of one end of an elongated region 16 of GaAs and which forms a quantum well. The two regions 12 and 14 form barrier regions due to the band offset in the AlGaAs semiconductor material relative to the conduction band of the GaAs of the quantum well 16. The two barrier regions 12 and 14 together with the quantum well region 16 form a quantum resonator. A pair of elongated GaAs regions 18 and 20 extend outwardly from the barrier regions 12 and 14 in mutual alignment in a first direction generally perpendicular to the quantum well region 16.

The regions 18 and 20 define source and drain electron waveguide regions, respectively, which can, when desirable, further include layers of metallization 22 and 24 as well as voltage terminals 26 and 28 for the application of respective supply potentials $V_s$ and $V_d$ thereacross.

At the outer end of the quantum well region 16 is located a metal contact or gate electrode 30 which includes a terminal 32 for the application of a gate voltage $V_g$ thereto.

In operation, electrons flow through the electron quantum waveguide comprising the source 18. They tunnel through the quantum resonator formed by the barrier regions 12 and 14 and the quantum well region 16. They are transported away from the quantum resonator by the drain electron quantum waveguide 20.

Further as shown in FIG. 1, a variable depletion region 34 is formed under the gate electrode metallization 30 which upon the application of a gate voltage $V_g$, changes the dimensions of the depletion region 34. A change in the depletion region dimension causes a change in the resonance region of the quantum well 16 and accordingly the energy and momentum condition for resonance tunneling. Such a change in the resonance condition of the quantum resonator acts to modulate current flow between the-source and drain regions 18 and 20 by modulating the tunneling currents.

Figure 2:
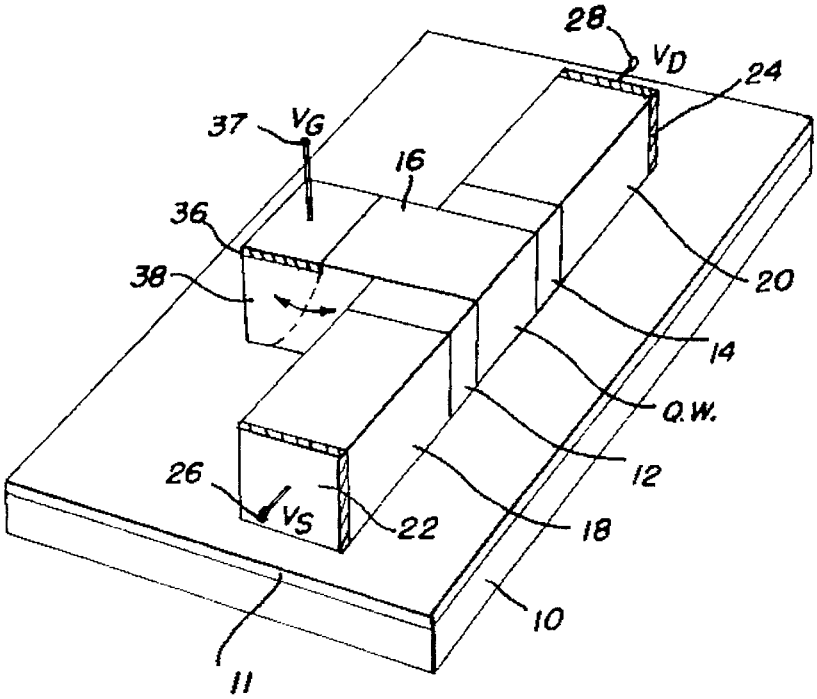

FIG. 2 illustrates an alternative technique for varying the lateral dimension of the quantum well region 16. In this case a variable pinched off region 38 is formed under the gate electrode metallization 36 as a result of a voltage $V_g$ applied to the gate terminal 37. The pinch off region 38 is caused by the existence of a force field under the gate electrode metallization 36 which substantially increases the conduction band potential in this local region, essentially excluding the tunneling electron wave functions from this region. The conditions for using a variable depletion region versus a variable pinch off region depend on the dimensions and doping concentration of the quantum well. For ordinary doping concentrations (less than $10^{18}$ $cm^{-3}$) and for quantum well sizes of, eg. 5 nm×10 nm×20 nm, there is a probability that many of the quantum wells in a circuit will not contain a single dopant atom. For device sizes this small, the pinch off region technique may be preferred in order to achieve a variable lateral confinement in the quantum well.

In FIG. 1, a variable lateral confinement transistor is shown in which both lateral dimensions are less than the coherence length of the electron wave function. A second embodiment of this invention is a variable lateral confinement transistor in which only one of the lateral dimensions is less than the electron wave function coherence length. In this case the variable depletion region or the variable pinch off region must change along the lateral dimension which is less than the wave function coherence length.

Figure 3:
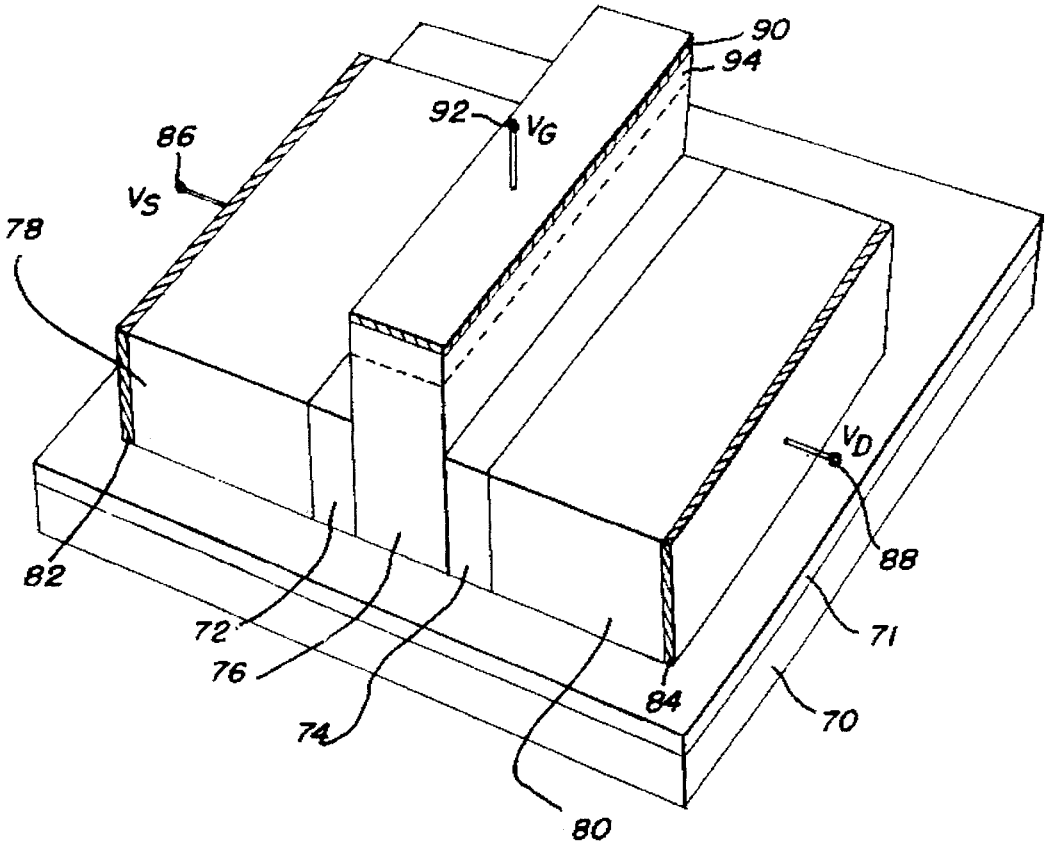

Referring now to FIG. 3, a resonant tunneling structure is formed on a semi-insulating GaAs substrate 70, which is isolated from the tunneling structure by a layer of AlGaAs 71. On the upper surface of the isolating AlGaAs layer 71 are two barrier regions 72 and 74 comprised of AlGaAs which are located on either side of one end of an elongated region 76 of GaAs and which is in the form of a quantum well. The two barrier regions 72 and 74 together with the quantum well region 76 form a quantum resonator. A pair of elongated region 78 and 80 extend outwardly from the barrier regions 72 and 74 in a direction generally perpendicular to the quantum well region 76.

The regions 78 and 80 define source and drain electron wave guide regions, respectively, which can, when desirable, further include layers of metallization 82 and 84 as well as voltage terminals 86 and 88 for the application of respective supply potentials $V_s$ and $V_g$ thereacross.

At the outer end of the quantum well region 76 is located a metal contact or gate electrode 90 which includes a terminal 92 for the application of a gate voltage $V_g$, thereto.

Further as shown in FIG. 3, a variable depletion region 94 is formed under the gate electrode metallization 90 which upon application of a gate voltage $V_g$ changes the dimensions of the depletion region 94. A change in the depletion region dimension causes a change in the resonance region of the quantum well 76 and accordingly the energy and momentum conditions for resonance tunneling. Such a change in the resonance condition of the quantum resonator acts to modulate current flow between the source and drain regions 78 and 80 by modulating the tunneling current. As discussed in connection with FIG. 2, a variable pinch off region can be used instead of a variable depletion region in order to achieve variable lateral confinement within the quantum resonator.

In the third embodiment of the invention as shown in FIG. 4, an epilayered structure is contemplated. As shown, a drain region 36 is formed of a first layer of n-GaAs over which is formed a first barrier layer 38 of AlGaAs followed by a third layer 40 of GaAs, the latter comprising a quantum well type layer. A second barrier layer 42 of AlGaAs is formed on the quantum well layer 40 and is lithographically etched to provide an uncovered portion 44 of the resonator layer 40. This is followed by the deposition of an outer region 46 of n-GaAs which acts as a source electrode and is also lithographically etched to match the side dimensions of the underlying barrier layer 42.

Following this is the formation of a metal contact layer 48 at the outer end of the quantum well layer 40 for defining a gate electrode which includes a terminal 49 for the application of a gate voltage $V_g$, with the epitaxial layers 36 and 46 of n-GaAs defining drain and source regions, respectively, and which can include, when desirable, outer metallic contact layers 50 and 52, including voltage terminals 54 and 56 for the application of source and drain supply voltages Vs and Vd, respectively. When desirable, the entire structure can be formed on an insulating GaAs substrate, shown by the phantom lines and reference number 58.

With respect to the configuration shown in FIG. 4, the quantum well layer 40 extends physically beyond the lateral dimension of the source region 46. A portion of the resonance region, formed by the quantum well layer 40, can be pinched off electrostatically by the voltage on the gate 48 or a depletion region 60 can be formed under the gate metallization 48. The voltage applied to the gate 48 controls the portion of the quantum well which is pinched off or it controls the depletion region and hence the portion of the quantum well remaining. The lateral sizes of the source region 46, the drain region 36, the quantum well region 40, and the barrier regions 38 and 42 are all smaller than the electron wave function coherence length in either one or two dimensions.

In the embodiment shown in FIG. 4 the dimensions of the quantum well are limited in both lateral dimensions to be less than the coherence length of the electron wave function. As noted for the planar structures shown in FIGS. 1 and 3, an alternate embodiment of this multi-epilayered structure would only limit one of the quantum well lateral dimensions to be less than the electron wave function coherence length.

The structures shown in FIGS. 1, 2, 3 and 4 define a variable lateral confinement transistor which operates on a resonant tunneling principle and which can be incorporated in planar or bulk type integrated circuit technology. The source, drain, gate, barrier and resonator components of the device shown and described herein can be formed from other semiconductor or other crystalline materials than gallium arsenide as long as barriers are formed from materials with a band offset with respect to the conduction band of the source, drain and resonator. Barriers may also be formed by electrostatic potentials under surface metal electrodes. Other orientations of the subject invention relative to a crystalline growth plane may be resorted to when desirable.

Furthermore, this structure has been described in terms of electron transport being responsible for the device operation. For special applications, hole transport or the transport of both electrons and holes may be desirable. In these cases similar structures would be used, but the band offsets and operating voltages would be chosen considering the appropriate carrier transport.

Thus, what has been shown and described is a variable lateral confinement transistor type of structure which can perform the operations of a conventional transistor and thus can function as a switch, an amplifier, an oscillator, etc. while being implemented in nanoelectronic and mesoscopic size regimes which can be used in both digital and analog circuits.

Having thus shown and described what is at present considered to be the preferred embodiments of the invention, it should be noted that the same has been made by way of illustration and not limitation. Accordingly, all modifications, alterations and changes coming within the spirit and scope of the invention are herein meant to be included.

What is claimed is:

1. A quantum interference device, comprising:

a semiconductor quantum waveguide structure comprising a primary current transmission path disposed between source and drain electrodes; a resonance region disposed between the source and drain electrodes and in the primary current transmission path, wherein the resonance region includes a quantum well and tunneling barrier regions disposed on opposite sides of the quantum well, wherein the resonance region is disposed within the primary current transmission path so as to form a quantum tunneling resonator; and a current control electrode located on said quantum waveguide structure remote from said primary current transmission path, said control electrode comprising a gate electrode, wherein a bias voltage is applied to the gate electrode which causes a change in dimensions of said resonance region and thereby changes in the current flow between said current carrying electrodes occur as a result of a change in the resonance tunneling and wherein said source, drain, quantum well, and barrier regions are smaller in width than the coherence length of the electron wave function.

2. The device of claim 1 wherein said source and drain electrodes include semiconductor source and drain regions adjacent said barrier regions and respective metal contacts on said source and drain regions, and wherein the gate electrode includes a metal contact on said quantum well region.

3. The device of claim 2 wherein said device comprises a planar type transistor, where said quantum well and said source and drain electrodes comprise regions of GaAs and said barrier regions are comprised of AlGaAs.

4. The device of claim 3 wherein said device further comprises a GaAs substrate with an AlGaAs isolation layer.

5. The device of claim 2 wherein said device comprises an epilayer type transistor structure and where said quantum well resonator region is comprised of a layer of GaAs, said barrier regions are comprised of layers of AlGaAs and said source and drain regions are comprised of layers of n-GaAs.

6. The device of claim 1 wherein said device is fabricated from material selected from Group III–V compounds.

7. The device of claim 6 wherein said source and drain regions are mutually aligned in a first direction and said quantum well resonator region extends outwardly from between said source and drain regions in a second direction.

8. The device of claim 7 wherein said gate electrode is located on a surface of said resonance region layer which is common to a barrier layer adjacent the source region layer.

9. A quantum interference device, comprising:

a semiconductor quantum waveguide structure comprising a primary current transmission path disposed between source and drain electrodes; a resonance region disposed between the source and drain electrodes and in the primary current transmission path, wherein the resonance region includes a quantum well and tunneling barrier regions disposed on opposite sides of the quantum well, wherein the resonance region is disposed within the primary current transmission path so as to form a quantum tunneling resonator; and a current control electrode located on said quantum waveguide structure remote from said primary current transmission path, said .control electrode comprising a gate electrode, wherein a bias voltage is applied to the gate electrode which causes a change in dimensions of said resonance region and thereby changes in the current flow between said current carrying electrodes occur as a result of a change in the resonance tunneling and wherein said source, drain, quantum well, and barrier regions are smaller in width and length than the coherence length of the electron wave function.

* * * * *